(12) United States Patent
Shiraishi

(10) Patent No.: US 10,739,409 B2
(45) Date of Patent: Aug. 11, 2020

(54) MANAGING APPARATUS FOR ELECTROCHEMICAL ELEMENT

(71) Applicant: GS Yuasa International Ltd., Kyoto (JP)

(72) Inventor: Takeyuki Shiraishi, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 183 days.

(21) Appl. No.: 15/911,523

(22) Filed: Mar. 5, 2018

(65) Prior Publication Data

US 2018/0259585 A1 Sep. 13, 2018

(30) Foreign Application Priority Data

Mar. 7, 2017 (JP) .................. 2017-042416

(51) Int. Cl.
*G01R 31/3842* (2019.01)
*B60R 16/033* (2006.01)
(Continued)

(52) U.S. Cl.
CPC .......... *G01R 31/3842* (2019.01); *B60L 58/12* (2019.02); *B60L 58/13* (2019.02); *B60L 58/14* (2019.02); *B60R 16/03* (2013.01); *B60R 16/033* (2013.01); *G01R 31/367* (2019.01); *G01R 31/3828* (2019.01); *G01R 31/3832* (2019.01);
(Continued)

(58) Field of Classification Search
CPC ............... G01R 31/3842; G01R 31/36; G01R 31/3832; G01R 31/3828; G01R 31/367; G01R 19/16571; B60L 58/12; B60L 58/14; B60L 2260/22; B60L 2240/549;
(Continued)

(56) References Cited

U.S. PATENT DOCUMENTS

2009/0319208 A1 12/2009 Kwon
2013/0300425 A1 11/2013 Shiraishi et al.

FOREIGN PATENT DOCUMENTS

JP 2006-149070 A 6/2006
JP 2006-211800 A 8/2006
(Continued)

OTHER PUBLICATIONS

European Patent Office, Extended European Search Report for Application No. 18159383.1, dated Aug. 1, 2018, 11 pages, Germany.

*Primary Examiner* — Amy He
(74) *Attorney, Agent, or Firm* — Alston & Bird LLP

(57) ABSTRACT

A managing apparatus for an electrochemical element mounted on a vehicle, including: a control unit activating at an interval of a predetermined time in a parked mode of the vehicle; and a current measuring unit measuring a current value. The control unit executes: a determination process of determining a reference value based on measured current values measured for a plurality of times upon the activation of the control unit; a check process of checking, at the interval of the predetermined time, whether or not a measured current value measured after the determination process deviates from a reference range that is based on the reference value; and an estimation process of estimating current, which has flowed in the parked mode by integrating, while the measured current value measured in the check process does not deviate from the reference range, current based on the reference value.

20 Claims, 12 Drawing Sheets

(51) Int. Cl.
    *G01R 31/3832*    (2019.01)
    *B60R 16/03*    (2006.01)
    *B60L 58/14*    (2019.01)
    *B60L 58/13*    (2019.01)
    *G01R 31/3828*    (2019.01)
    *B60L 58/12*    (2019.01)
    *G01R 31/367*    (2019.01)

(52) U.S. Cl.
    CPC ..... *B60L 2240/549* (2013.01); *B60L 2260/22* (2013.01); *Y02T 10/705* (2013.01); *Y02T 10/7005* (2013.01); *Y02T 10/7044* (2013.01)

(58) Field of Classification Search
    CPC ..... B60R 16/03; B60R 16/033; Y02T 10/705; Y02T 10/7044; Y02T 10/7005
    See application file for complete search history.

(56) References Cited

FOREIGN PATENT DOCUMENTS

| | | |
|---|---|---|
| JP | 2007-237868 A | 9/2007 |
| JP | 2010-025563 A | 2/2010 |
| JP | 2010-030400 A | 2/2010 |

…

MANAGING APPARATUS FOR ELECTROCHEMICAL ELEMENT

CROSS REFERENCE TO RELATED APPLICATIONS

This application claims priority to and the benefit of Japanese Patent Application No. 2017-042416, filed on Mar. 7, 2017, the contents of which as are hereby incorporated by reference in their entirety.

BACKGROUND

Related Field

The technique disclosed in the present specification relates to a managing apparatus for an electrochemical element.

Description of Related Art

As disclosed in JP 2006-149070, a managing apparatus for a vehicular battery estimates the state of charge (SOC) of a battery mounted on a vehicle. The managing apparatus estimates the SOC of the battery by detecting a current value of the battery and integrating the detected current values.

In the so-called current integration method, it is important to reduce accumulation of errors in current integration, and thus precise current measurement is required.

The current measurement range of a battery is wide, i.e., several milliamperes in the parked mode of a vehicle, several hundred amperes in starting up the vehicle, and a maximum of thousand amperes or greater. Accordingly, in the case where current in every mode is measured with a single current sensor, a certain error may occur in measuring minor current (several milliamperes to several tens of milliamperes). In measuring the minor current, the measured current value tends to largely vary around the true value due to influence of noises and the like. This may further increase the measurement error.

In measuring the minor current in the parked mode, measured current values measured for a plurality of times may be averaged, and the current that has flowed in the parked mode may be estimated based on the averaged current value. However, sometimes the managing apparatus is in the suspend state except for periodical monitoring to minimize power consumption while the vehicle is in the parked mode. This configuration may make it difficult to measure current for a certain number of times enough to attain precise measurement.

BRIEF SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present specification discloses the technique of improving precision in estimating current, which has flowed in the parked mode, while minimizing an increase in power consumption.

A managing apparatus for an electrochemical element mounted on a vehicle according to an aspect of the present invention includes: a control unit activating at an interval of a predetermined time in a parked mode of the vehicle; and a current measuring unit measuring a current value. The control unit executes: a determination process of determining a reference value based on measured current values measured for a plurality of times upon the activation of the control unit; a check process of checking, at the interval of the predetermined time, whether or not a measured current value measured after the determination process deviates from a reference range that is based on the reference value; and an estimation process of estimating current, which has flowed in the parked mode by integrating, while the measured current value measured in the check process does not deviate from the reference range, current based on the reference value.

BRIEF DESCRIPTION OF THE FIGURES

The foregoing and other features of the present invention will become apparent from the following description and drawings of an illustrative embodiment of the invention in which.

DETAILED DESCRIPTION OF VARIOUS EMBODIMENTS

Figure 1:
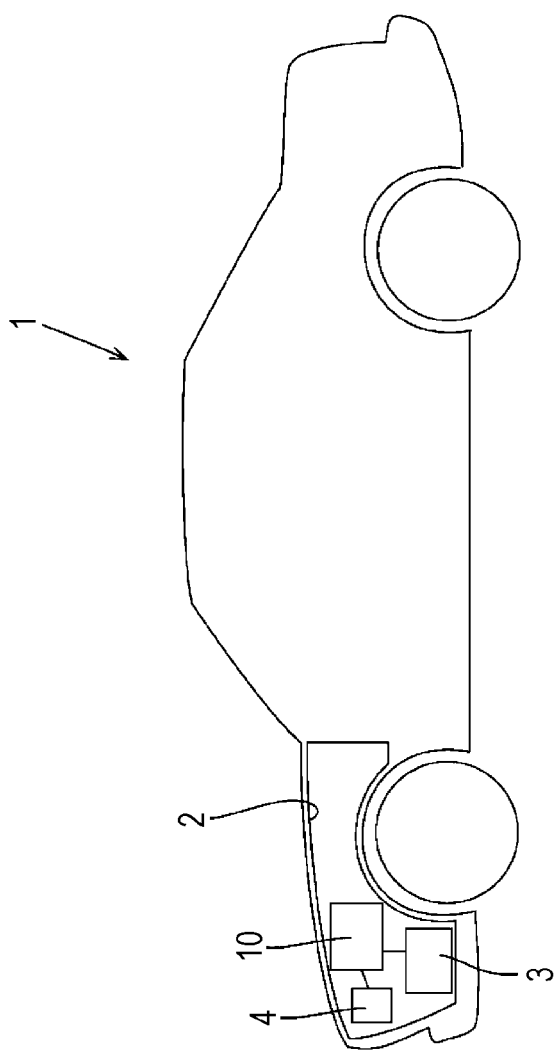
FIG. 1 illustrates a vehicle on which an energy storage apparatus is mounted.

According to an aspect of the present invention, there is provided a managing apparatus for an electrochemical element mounted on a vehicle including: a control unit activating at an interval of a predetermined time in a parked mode of the vehicle; and a current measuring unit measuring a current value. The control unit executes: a determination process of determining a reference value based on measured current values measured for a plurality of times upon the activation of the control unit; a check process of checking, at the interval of the predetermined time, whether or not a measured current value measured after the determination process deviates from a reference range that is based on the reference value; and an estimation process of estimating current, which has flowed in the parked mode by integrating, while the measured current value measured in the check process does not deviate from the reference range, current based on the reference value.

The reference value is determined through the determination process, and thereafter, through the check process, whether or not the measured current value deviates from the reference range is checked. As compared to a method in which every time the reference value is determined, an increase in power consumption is suppressed. As compared to a method in which the measured current values are integrated as they are, the precision in estimating the current that has flowed in the parked mode improves.

Overview of Present Exemplary Embodiment

Firstly, a description will be given of the overview of a managing apparatus for an electrochemical element disclosed in the present exemplary embodiment.

A managing apparatus for an electrochemical element mounted on a vehicle according to an aspect of the present invention includes: a control unit activating at an interval of a predetermined time in a parked mode of the vehicle; and a current measuring unit measuring a current value. The control unit executes: a determination process of determining a reference value based on measured current values measured for a plurality of times upon the activation of the control unit; a check process of checking, at the interval of the predetermined time, whether or not a measured current value measured after the determination process deviates from a reference range that is based on the reference value; and an estimation process of estimating current, which has flowed in the parked mode by integrating, while the measured current value measured in the check process does not deviate from the reference range, current based on the reference value.

Determining the reference value every time the control unit activates based on measured current values measured for a plurality of times improves the precision in estimating the current that has flowed in the parked mode. However, when the reference value is determined upon every activation of the control unit, the time taken for each activation of the control unit increases, and consequently power consumption in the parked mode increases. Nevertheless, reducing the number of times of measuring current will impair the precision in estimating the current that has flowed in the parked mode.

In view of the foregoing, the inventor of the present invention has arrived at the following idea: by determining the reference value through a determination process, and thereafter checking, through a check process, whether or not the measured current value deviates from the reference range, integration error is reduced and the precision in estimating the current that has flowed in the parked mode improves, as compared to the scheme in which measured current values or previously measured constant reference values are integrated.

According to the present configuration, it is not necessary for the control unit to measure current for a plurality of times upon every activation of the control unit in order to determine the reference value. Hence, as compared to the scheme in which the control unit determines the reference value upon every activation of the control unit and integrates the reference values, an increase in power consumption is suppressed. As compared to the scheme in which the measured current values are integrated as they are, the precision in estimating the current that has flowed in the parked mode improves.

In the check process, when the measured current value exceeds the reference range successively for a predetermined number of times, the control unit may update the reference value through the determination process.

With such a configuration, the control unit updates the reference value when the current value flowing in the parked mode has changed. Therefore, as compared to the configuration in which the reference value once determined is continuously used, the precision in estimating the current flowing in the parked mode improves.

The electrochemical element may exhibit a flat region where, in the relationship between SOC and OCV, an OCV variation amount relative to an SOC variation amount is smaller than a predetermined value.

The electrochemical element of a vehicle is often used with the SOC falling within a range of 70% to 90% in consideration of charging and discharging. However, in the case where the electrochemical element exhibits the flat region where the SOC falls within a range of 70% to 90%, it is difficult to reset the accumulation errors in SOC estimation by the OCV method. Accordingly, in the case where the current integration method must be inevitably employed, the present technique that improves the precision in estimating the current flowing in the parked mode is extremely effective.

Details of Present Exemplary Embodiment

With reference to FIGS. 1 to 12, a further detailed description will be given of an embodiment disclosed in the present specification.

As shown in FIG. 1, the present embodiment exemplifies an energy storage apparatus 10 mounted on a vehicle 1 such as an automobile. The energy storage apparatus 10 is connected to a vehicle load 3 such as a starting motor for starting up the engine or an electronic component mounted on the vehicle 1, a vehicle power generator 4 such as an alternator, and a vehicle ECU (Electronic Control Unit) 5.

Figure 2:
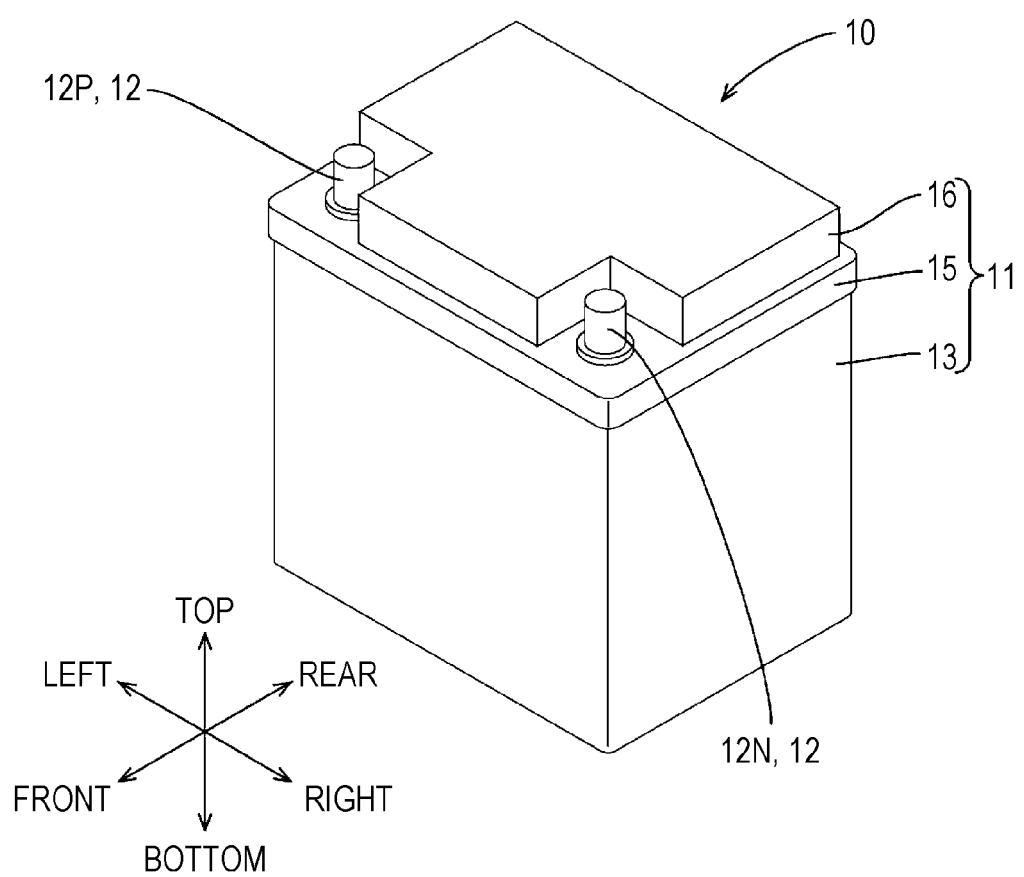
FIG. 2 is a perspective view of the energy storage apparatus.
Figure 3:
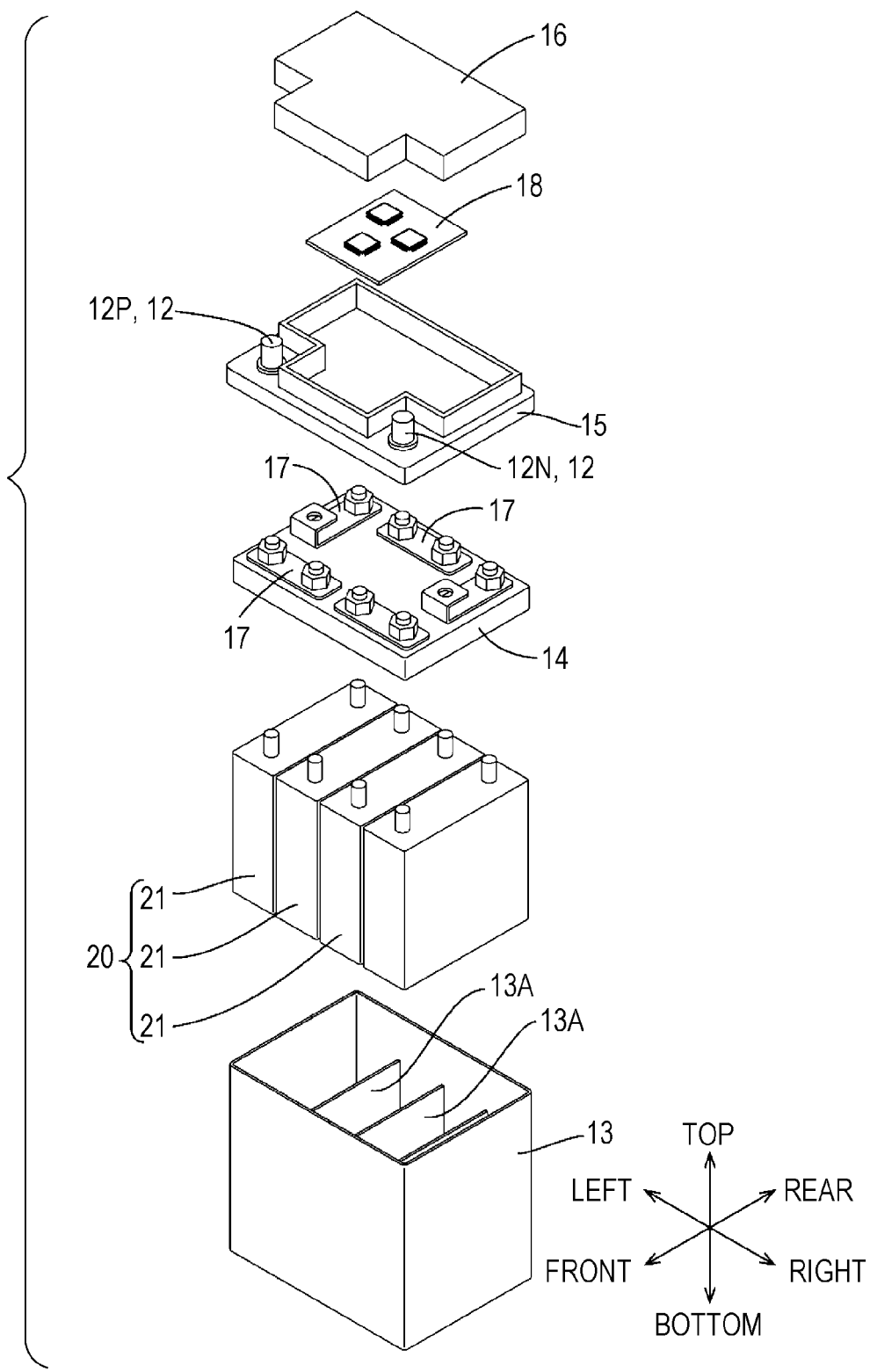
FIG. 3 is an exploded perspective view of the energy storage apparatus.

As shown in FIG. 2, the energy storage apparatus 10 includes a block-like battery case 11. As shown in FIG. 3, the battery case 11 houses an assembled battery 20 made up of a plurality of (four in the present embodiment) energy storage elements (an exemplary "electrochemical element") 21 connected in series, a control board 18 and the like.

In the following description, in referring to FIGS. 2 and 3, the top-bottom direction is based on the top-bottom direction of the battery case 11 being horizontally placed relative to the installation surface. The front-rear direction is based on the direction along the short-side portion (the depth direction) of the battery case 11, in which the front left side in the drawings is the front. The right-left direction is based on the direction along the long-side portion of the battery case 11, in which the front right side is the right direction.

The battery case 11 is made of synthetic resin. As shown in FIG. 3, the battery case 11 includes a box-shaped case body 13 opening upward, a positioning member 14 positioning a plurality of energy storage elements 21, a middle lid 15 mounted on the upper part of the case body 13, and a top lid 16 mounted on the upper part of the middle lid 15.

As shown in FIG. 3, in the case body 13, cell chambers 13A respectively housing the energy storage elements 21 are juxtaposed to each other in the right-left direction.

The energy storage elements 21 are each a lithium ion battery using a negative electrode active material of a graphite-based material such as graphite, graphitizable carbon, non-graphitizable carbon or the like, and a positive electrode active material of an iron phosphate-based material such as lithium iron phosphate.

As shown in FIG. 3, a plurality of bus bars 17 are disposed at the upper surface of the positioning member 14. By the positioning member 14 disposed at the upper part of the energy storage elements 21 housed in the case body 13, the energy storage elements 21 are positioned. The energy storage elements 21 are connected in series by the plurality of bus bars 17, to structure the assembled battery 20.

The middle lid 15 is substantially quadrangular as seen in a plan view. As shown in FIGS. 2 and 3, at the opposite ends in the right-left direction of the middle lid 15, external terminals 12, to which not-shown battery terminals provided at the vehicle 1 are connected, are provided while being embedded in the middle lid 15. The pair of external terminals 12 is made of metal such as lead alloy. One is a positive electrode terminal 12P, and the other one is a negative electrode terminal 12N.

As shown in FIG. 3, the middle lid 15 houses the control board 18. By the middle lid 15 being mounted on the case body 13, the assembled battery 20 and the control board 18 are connected to each other.

Figure 4:
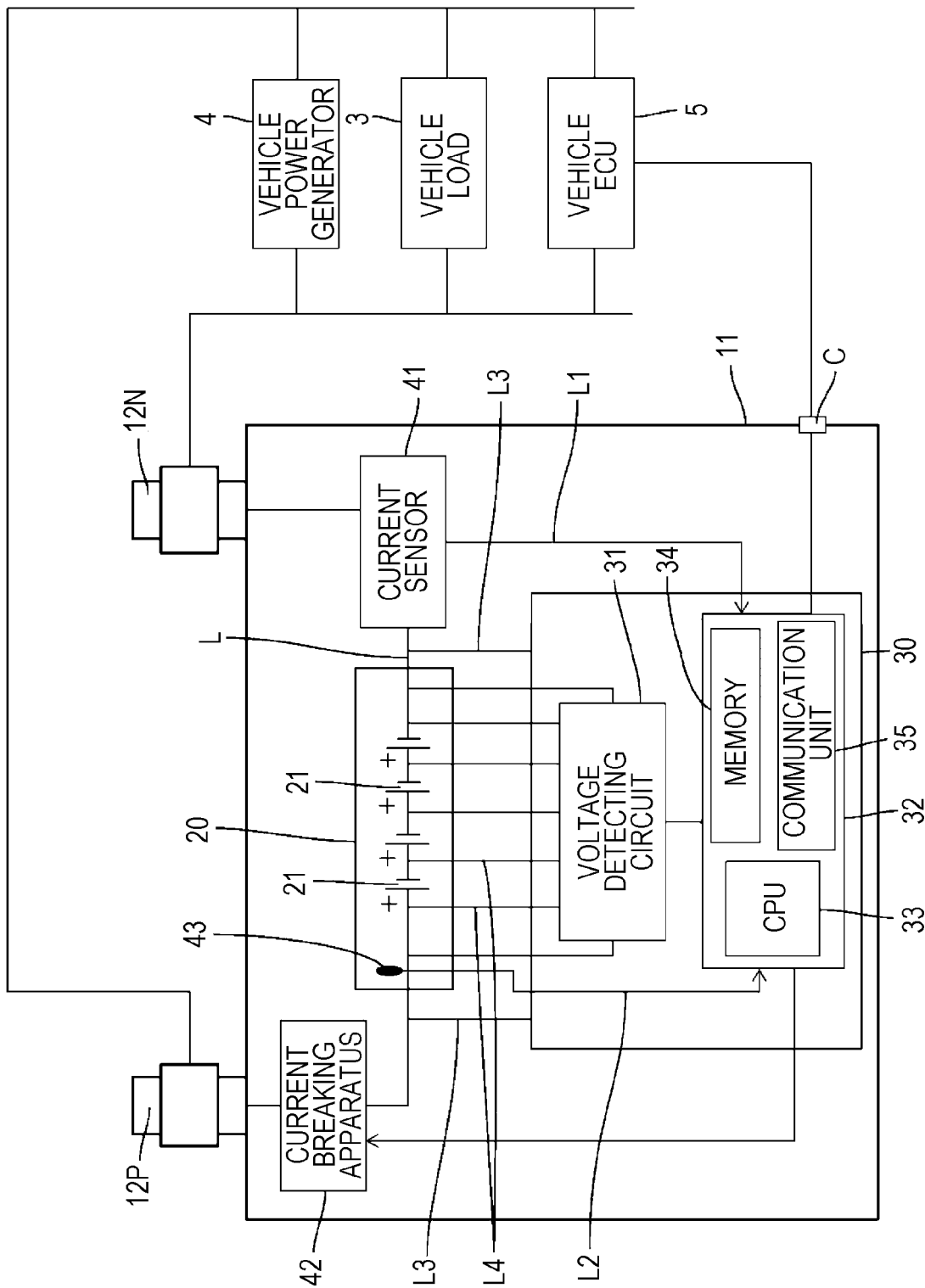
FIG. 4 is a block diagram showing electrical configuration of the energy storage apparatus.

With reference to FIG. 4, a description will be given of the electrical configuration of the energy storage apparatus 10.

As shown in FIG. 4, the energy storage apparatus 10 includes the assembled battery 20, a battery managing unit (hereinafter referred to as the "BMU", being an exemplary "managing apparatus") 30, a current sensor (an exemplary "current measuring unit") 41, a current breaking apparatus 42, and a temperature sensor 43, which are disposed in the battery case 11.

The assembled battery 20, the current sensor 41, and the current breaking apparatus 42 are connected in series via an energizing line L. The positive electrode of the assembled battery 20 is connected to the positive electrode terminal 12P via the current breaking apparatus 42, and the negative electrode is connected to the negative electrode terminal 12N via the current sensor 41. The energy storage apparatus 10 is connected to the vehicle load 3, the vehicle power generator 4, and the vehicle ECU 5 via the positive electrode terminal 12P and the negative electrode terminal 12N.

The current sensor 41 measures a current value flowing through the energizing line L. The current sensor 41 is connected to the BMU 30 by a signal line L1. The measured current value measured by the current sensor 41 is read by the BMU 30 through the signal line L1.

The current breaking apparatus 42 is a semiconductor switch such as an FET or a relay. In response to a control signal from the BMU 30, the current breaking apparatus 42 breaks the current between the assembled battery 20 and the positive electrode terminal 12P.

The temperature sensor 43 is of the contact type or the contactless type, and measures the temperature of the assembled battery 20. The temperature sensor 43 is connected to the BMU 30 by a signal line L2. The measured temperature value measured by the temperature sensor 43 is read by the BMU 30 through the signal line L2.

The BMU 30 includes a voltage detecting circuit 31 and a control unit 32, which are mounted on the control board 18. The BMU 30 is supplied with power from the assembled battery 20 by being connected to the energizing line L by a power supply line L3.

The voltage detecting circuit 31 is connected to the energy storage elements 21 via voltage detecting lines L4. In response to an instruction from the CPU 33, the voltage detecting circuit 31 detects the cell voltage of each of the energy storage elements 21 and the battery voltage of the assembled battery 20 (the total voltage of the plurality of energy storage elements 21).

The control unit 32 includes a CPU 33 being the central processing unit, a memory 34, and a communication unit 35.

The memory 34 is, for example, a nonvolatile memory such as a flash memory or an EEPROM. The memory 34 stores various programs such as a program for managing the energy storage elements 21 or the assembled battery 20, a dark current estimation program for estimating an accumulated dark current value, and an SOC estimation program for estimating the SOC of the assembled battery, and data required in executing the programs, the allowable measurement error range, the allowable deviation count and the like.

The communication unit 35 is connected to the vehicle ECU 5 via a connecting connector C provided at the battery case 11, and capable of establishing communication with the vehicle ECU 5 through the LIN communication or the CAN communication.

The CPU 33 is the central processing unit, and periodically monitors the current, voltage and the like of the energy storage elements 21 based on the output signal from the current sensor 41, the voltage detecting circuit 31, the temperature sensor 43 and the like. Upon detecting any abnormality, the CPU 33 outputs a control signal to the current breaking apparatus 42 thereby breaking current between the assembled battery 20 and the positive electrode terminal 12P, to prevent the assembled battery 20 from malfunctioning.

The CPU 33 executes an SOC estimation process for estimating the SOC of the assembled battery 20 by the SOC estimation program stored in the memory 34.

The SOC of the assembled battery 20, is represented by the following Equation (1) where Y is the residual capacity [Ah] of the assembled battery 20, and Y0 is the full-charge capacity [Ah] of the assembled battery 20:

$$SOC = Y/Y0 \times 100 \tag{1}$$

Figure 5:
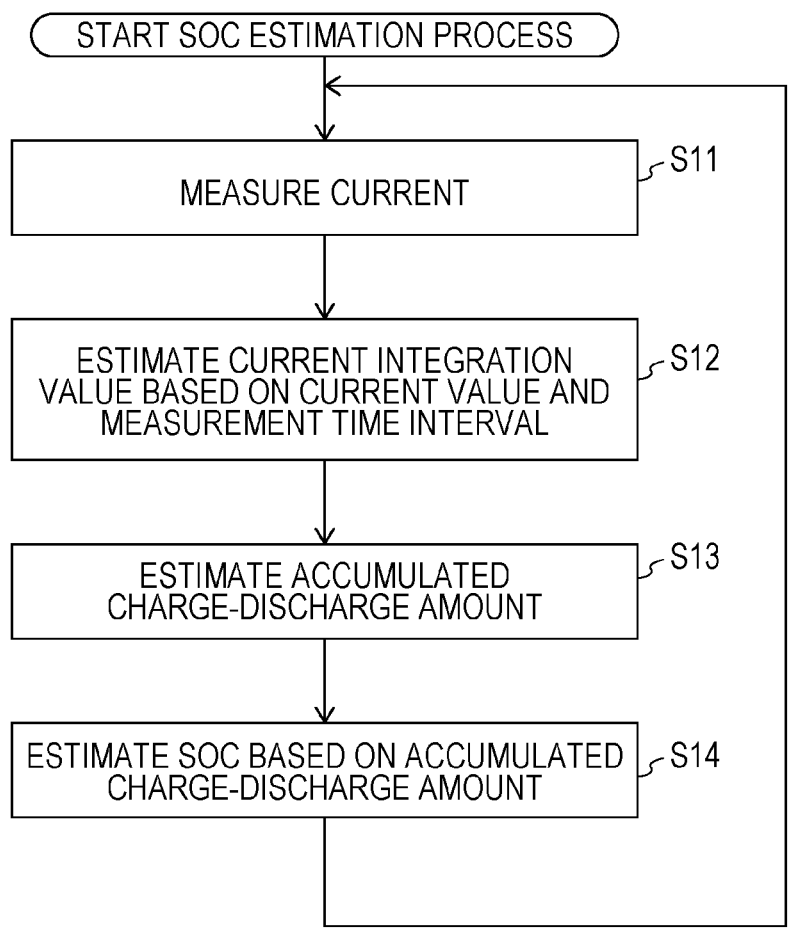
FIG. 5 is a flowchart showing an SOC estimation process.

With reference to FIG. 5, a description will be given of the SOC estimation process.

In the SOC estimation process, by measuring the charge-discharge current of the assembled battery 20, and adding a current integration value to an initial SOC, the SOC at the current time point is estimated.

As shown in FIG. 5, in the SOC estimation process, firstly, the CPU 33 issues an instruction to the current sensor 41, so that the current sensor 41 measures a current value flowing through the energizing line L (S11). The current value measured by the current sensor 41 is stored in the memory 34.

Next, the CPU 33 multiplies a current value I measured by the current sensor 41 by a time interval $\Delta T$ at which the current sensor 41 performs measurement, to obtain a current integration value $I\Delta T$ (S12). The CPU 33 integrates the current integration values $I\Delta T$ regarding discharge as minus and charge as plus, thereby estimating an accumulated charge-discharge amount $\int I\Delta T$ (S13).

By adding the SOC variation amount calculated from the accumulated charge-discharge amount $\int I\Delta T$ to the initial SOC, the CPU 33 estimates the current-time-point SOC as represented by the following Equation (2) (S14):

$$SOC = SOC0 + \int I \Delta T/Y0 \tag{2}$$

In the equation, SOC is the current-time-point SOC, SOC0 is the initial SOC, I is the current value, and Y0 is the full-charge capacity of the assembled battery 20.

Figure 6:
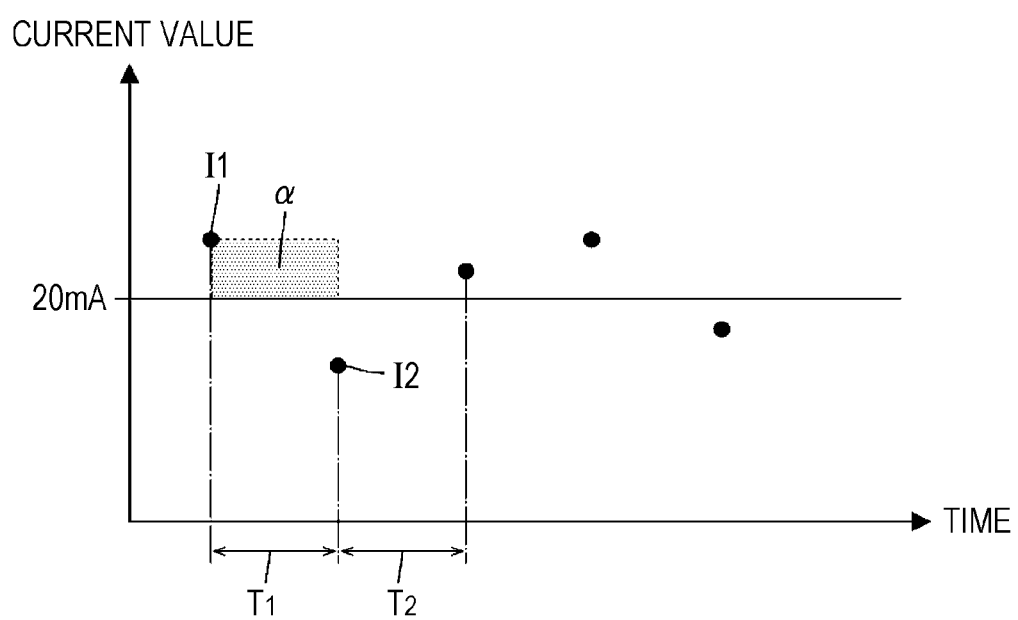
FIG. 6 is a graph showing measured values of dark current obtained by periodical measurement.

In the current integration method, SOC is estimated by integrating the measured current values. Accordingly, in order to improve the SOC estimation precision, it is desirable to minimize current measurement errors. However, the discharge current of the assembled battery 20 in the parked state is a minor current (dark current) of several milliamperes to several tens of milliamperes. The discharge current of the assembled battery at cranking in starting up an engine is several hundred amperes or thousand amperes or greater at a maximum. Thus, the current sensor 41 measures current values over a wide range. FIG. 6, in which X-axis indicates time and Y-axis indicates current values, shows the measurement values of the minor current obtained by periodical measurement. It can be seen that, when the current sensor 41 measures minor current (several milliamperes to several tens of milliamperes), the measured current value tends to largely vary around the true value (20 [mA]) due to influence of noises and the like, and measurement errors tend to be great.

When the SOC is estimated using the measured current values measured by the current sensor 41 as they are, as shown in FIG. 6, the integration errors are accumulated by an area α, which is obtained by a measured current value I1 and a measurement interval T1. That is, when the parked time of the vehicle 1 is prolonged, a reduction in SOC estimation precision due to accumulation of these integration errors becomes a concern.

A method for solving the measurement errors due to current integration may be an OCV reset method of resetting accumulation of errors due to current integration, in combination with an SOC determination method which includes estimating SOC based on the previously obtained relationship between SOC and the open circuit voltage (OCV) of the assembled battery.

Figure 7:
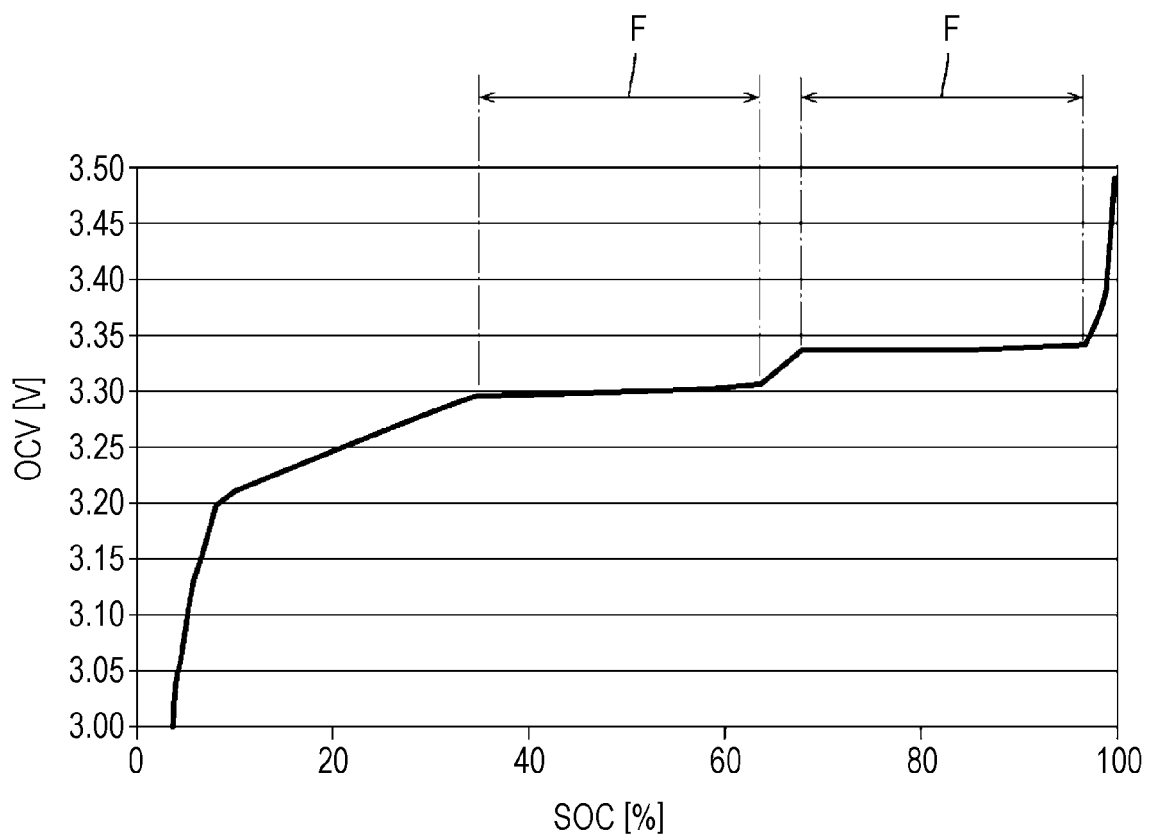
FIG. 7 is a graph showing the SOC-OCV relationship of the energy storage element.

FIG. 7 shows the relationship between SOC and OCV, in which X-axis indicates SOC [%] and Y-axis indicates OCV [V], with a lithium ion battery employing a positive electrode active material of iron phosphate such as lithium iron phosphate. It is known that there exists, in the range where SOC falls within a range of 30% to 95%, a flat region F where the OCV variation amount relative to the SOC variation amount is smaller than a predetermined value. Specifically, the flat region refers to a region in which the OCV variation amount falls within a range of 2 [mV] to 5 [mV] or smaller relative to an SOC variation of 1 [%]. In the flat region F, it is difficult to reset the SOC estimation errors even if the OCV reset method is performed.

The CPU 33 executes the dark current estimation process by the dark current estimation program stored in the memory 34, and precisely estimates power consumption due to minor discharge current (dark current) of the assembled battery 20 in the parked state. By integrating the estimation values, the CPU 33 precisely estimates the SOC of the assembled battery in the parked state.

The "parked state" refers to the state where a predetermined time has been elapsed since last communication from the vehicle ECU to the CPU. The "dark current" refers to minor current that is consumed by a clock, audio equipment, security equipment and the like mounted on the vehicle in the parked state.

Figure 8:
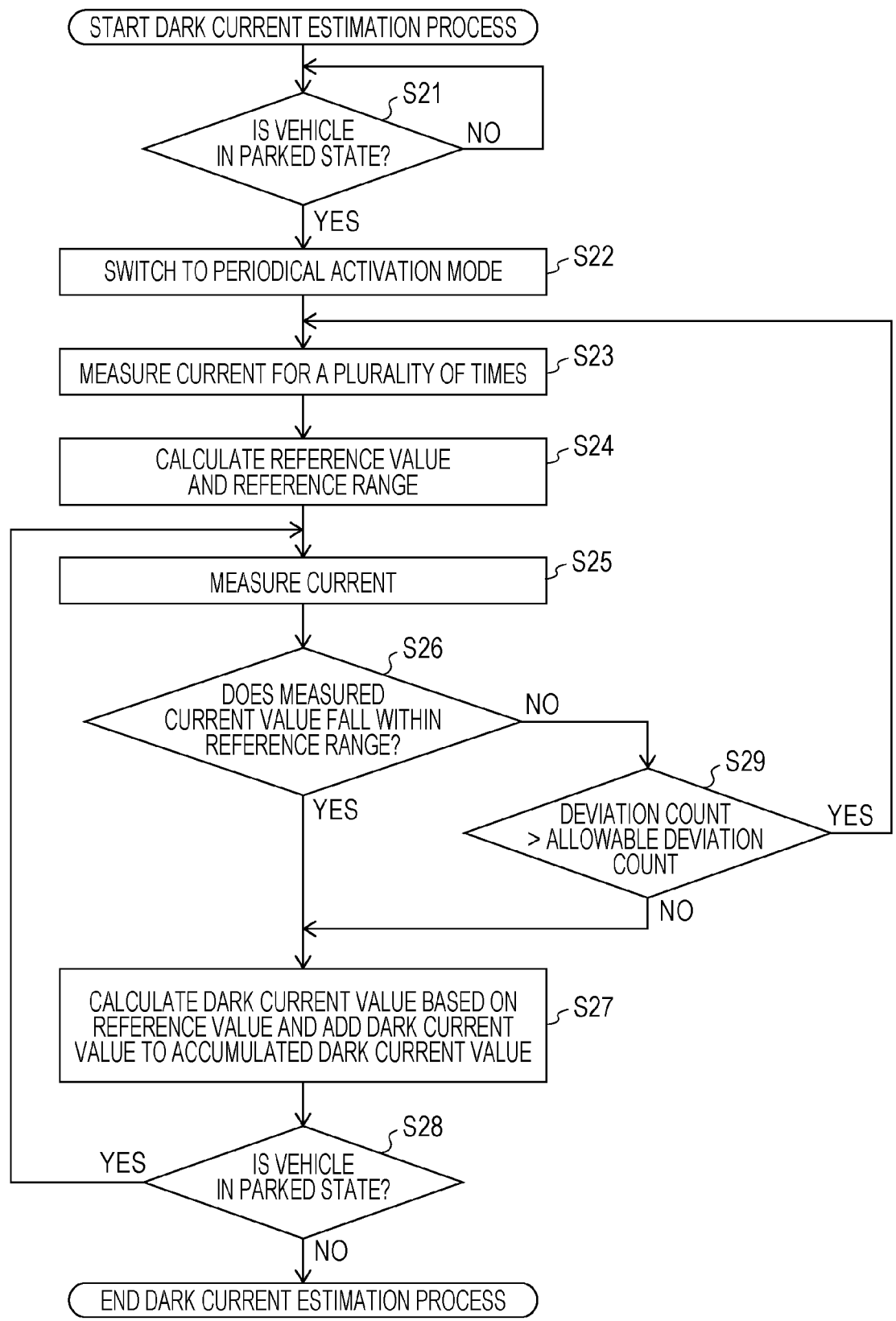
FIG. 8 is a flowchart of a dark current estimation process.

With reference to FIG. 8, a description will be given of a dark current estimation process.

Figure 9:
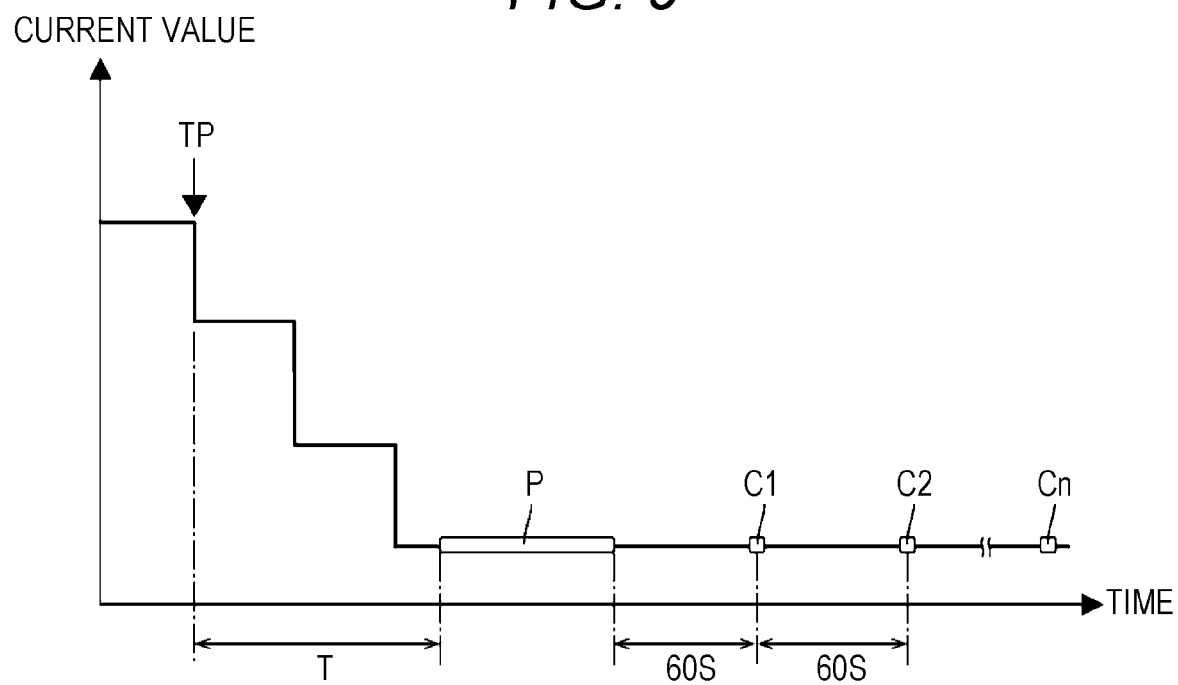
FIG. 9 is a graph showing the timing of a determination process and that of a check process.

In the dark current estimation process, firstly, the CPU 33 determines whether or not the vehicle 1 has entered the parked state (S21). Specifically, as shown in FIG. 9 in which X-axis indicates time and Y-axis indicates current values, showing the timing of a determination process and a check process, the CPU 33 determines whether or not a predetermined time T has elapsed since a time point TP where communication from the vehicle ECU 5 to the CPU 33 has ceased.

When the vehicle 1 has not entered the parked state (S21: NO), the CPU 33 continues monitoring until the vehicle 1 enters the parked state.

When the vehicle 1 has entered the parked state, in order to reduce power consumption, the CPU 33 enters the suspend state (sleep mode), and switches to a periodical activation mode where the CPU 33 activates periodically at an interval of a predetermined time (once/min) for monitoring voltage, current and the like (S22).

Then, at the first activation in the periodical activation mode, the CPU 33 executes the determination process.

In the determination process, the current sensor 41 measures, for a plurality of times, minor discharge current (S23), and the CPU 33 determines the average value of the measured current values obtained for the plurality of times as the reference value of the dark current in the parked state (S24).

Figure 10:
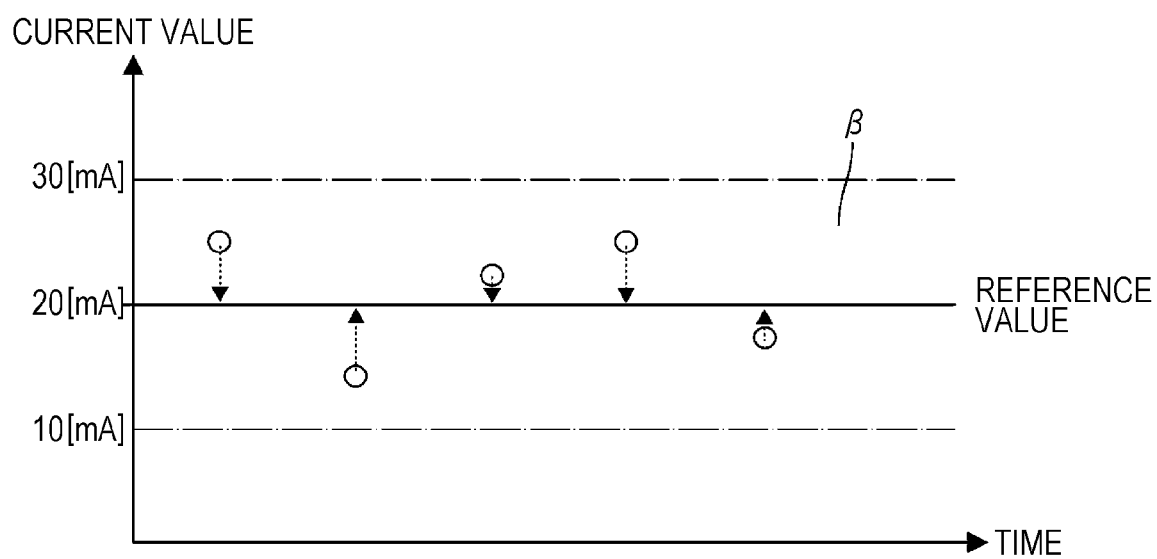
FIG. 10 is a graph showing the reference value and the reference range of dark current.

That is, as shown in FIG. 10 in which X-axis indicates time and Y-axis indicates current values, showing the reference value of dark current and the reference range, the true value (reference value) of largely varying dark current is determined through the determination process. The CPU 33 determines, based on the calculated reference value and the allowable measurement error range, a measurement variation correctable reference range (S24), and stores the reference value and the reference range in the memory 34.

Specifically, in the determination process, at the timing of the first activation of the CPU 33 (see P in FIG. 9), the current sensor 41 measures minor discharge current for about several thousand times. Based on the measured current values, the CPU 33 determines that the reference value (the average value) is 20 [mA] (see FIG. 10). Based on the calculated reference value and the allowable measurement error range (±10 [mA]) stored in the memory 34, the CPU 33 determines a reference range B, and stores the reference value and the reference range in the memory 34. As shown in FIG. 10, when the reference value is 20 [mA] and the allowable measurement error range stored in the memory 34 is ±10 [mA], the reference range B is from 10 [mA] to 30 [mA].

When the time taken for the current measurement by the current sensor 20 is 1 msec and the time during which the CPU 33 is in operation for periodical monitoring is normally about 10 msec, the time taken for performing current measurement for several thousand times in the determination process becomes long, i.e., about several seconds.

Next, after determining the reference value by the determination process, the CPU 33 performs the check process.

As shown in FIG. 9, in the check process, the CPU 33 measures current with the current sensor 41 every time the CPU 33 activates following the determination process (S25), and checks whether or not the measured current value deviates from the reference range (S26).

In other words, in the check process, the CPU 33 measures minor discharge current at the interval of a predetermined time at which the CPU 33 activates, and checks whether or not the measured current value deviates from the reference range.

In the check process, when the measured current value does not deviate from the reference range (S26: YES), the CPU 33 multiplies the activation period interval at which the CPU 33 activates by the reference value, to calculate a dark current integration value since the last current measurement until the current-time-point current measurement, and adds the dark current integration value to the accumulated dark current value (S27). This process in S27 corresponds to the "estimation process".

After adding the dark current integration value, the CPU 33 determines whether or not the parked state is continuing (S28). When the parked state is continuing (S28: YES), control returns to S25. When the parked state is not continuing (S28: NO), the CPU 33 ends the dark current estimation process. Thus, the accumulated dark current value consumed by the vehicle in the parked state is calculated.

In the check process, when the measured current value deviates from the reference range (S26: NO), the CPU 33 checks whether or not the deviation count exceeds the allowable deviation count stored in the memory 34 (S29). When the deviation count does not exceed the allowable deviation count (S29: NO), the CPU 33 executes the processes in S27 and the following steps.

When the deviation count exceeds the allowable deviation count (S29: YES), the CPU 33 returns to S23, and executes the determination process. That is, when the deviation count exceeds the allowable deviation count, the CPU 33 determines that the dark current value has changed, and updates the reference value by the determination process.

Specifically, after the reference value is determined through the determination process, the CPU 33 once measures the minor discharge current every time the CPU 33 activates at the interval of a predetermined time (60 sec) (see C1, C2, . . . , Cn in FIG. 9). When the reference value is 20 [mA] and the reference range is from 10 [mA] to 30 [mA], and the minor discharge current measured with the current sensor 41 is 25 [mA], the activation period interval (60 sec) of the CPU 33 is multiplied by the reference value (20 [mA]), to calculate the dark current value for every activation period. The dark current value is added to the accumulated dark current value, to calculate the accumulated dark current value in the parked state at the current time point.

When the time during which the CPU 33 is in operation for the periodical monitoring is about 10 msec, the time required for performing a single-time current measurement in the check process is about 1 msec. Therefore, there exist little variations in the operational time of the CPU due to the influence of the check process.

That is, the operational time of the CPU 33 after the determination process is one several-hundredth of the operational time of the CPU performing the determination process.

When the minor discharge current measured with the current sensor 41 deviates from the reference range for a plurality of times due to, e.g., minor charge of a not-shown solar photovoltaic power generation apparatus mounted on the vehicle 1 or the like, the CPU 33 determines that the dark current value has changed, and returns to the determination process (S23). In the determination process, the CPU 33 again measures current for about several thousand times, and updates the reference value from the measured current values (S24). After updating the reference value, the CPU 33 executes the processes in S25 and the following steps, thereby calculating the accumulated dark current value when the vehicle is in the parked state.

Figure 11:
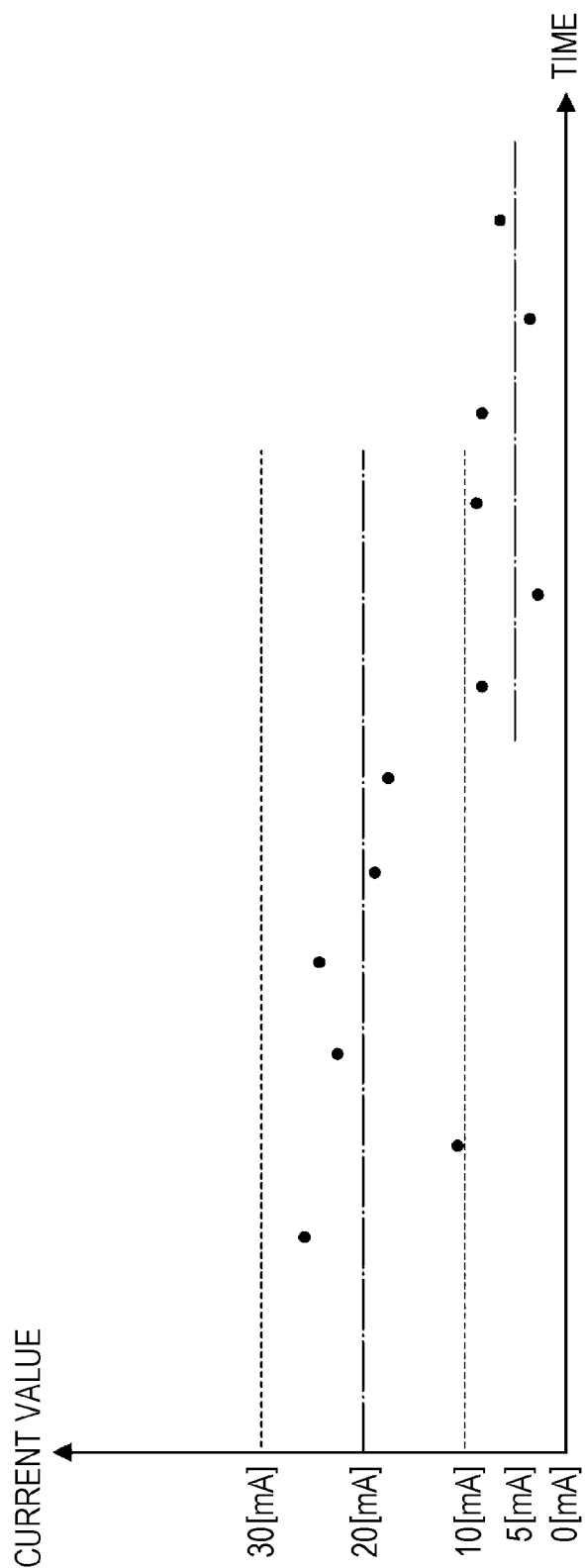
FIG. 11 is a graph showing measured values of dark current obtained by periodical measurement, in which dark current value has changed.

Specifically, as shown in FIG. 11 in which X-axis indicates time and Y-axis indicates current values, showing the dark current measurement values obtained by periodical measurement, when the reference value is 20 [mA] and the reference range is from 10 [mA] to 30 [mA], and the minor discharge current measured with the current sensor 41 is 5 [mA] for a plurality of times, the CPU 33 determines that the dark current value has changed, and returns to the determination process.

Figure 12:
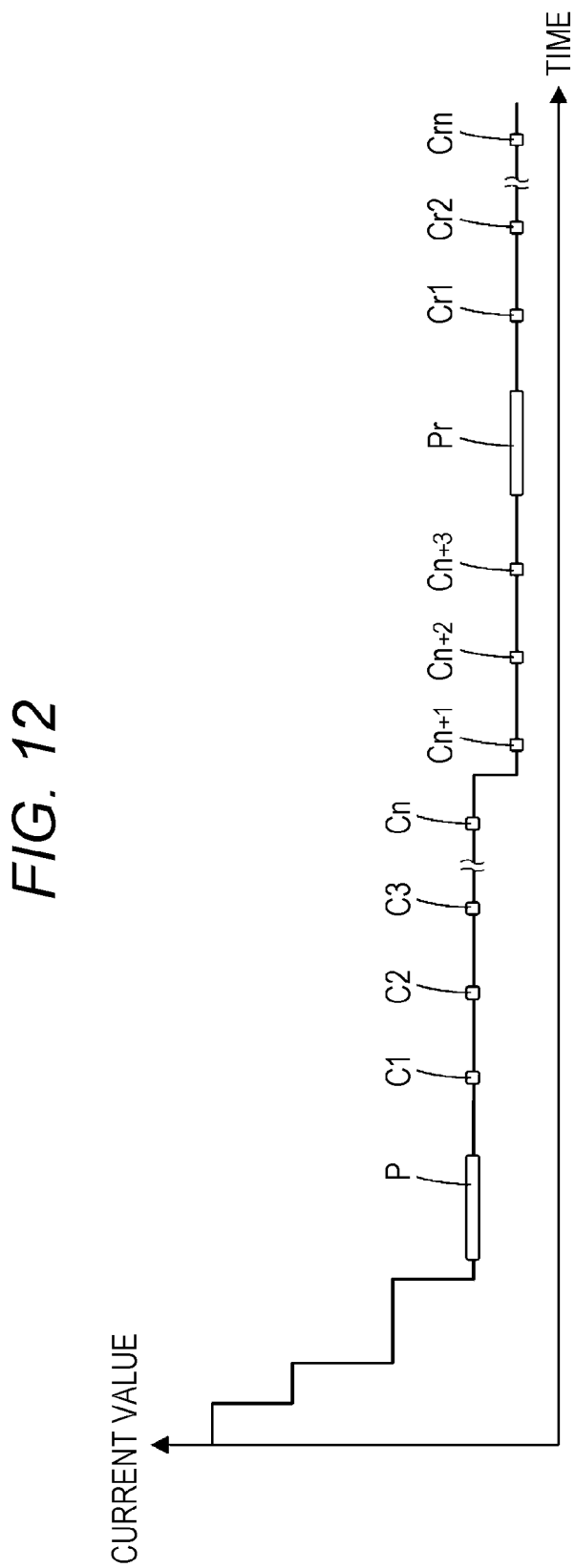
FIG. 12 is a graph showing the timing of the determination process and that of the check process, in which dark current value has changed.

As shown in FIG. 12 in which X-axis indicates time and Y-axis indicates current values, showing the timing of the determination process and that of the check process, after again measuring current for about several thousand times in the determination process (see Pr in FIG. 12) and updating the reference value through the determination process, the CPU 33 once measures discharge current at an interval of a predetermined time (see Cr1, Cr2, . . . , Crn in FIG. 12), and calculates the accumulated dark current value when the vehicle is in the parked state.

As has been described above, through the determination process, the reference value of dark current discharged by the vehicle 1 while parking is determined, and the reference values are integrated to calculate the accumulated dark current value. Therefore, provided that the measurement precision of the current sensor 41 of the vehicle 1 is insufficient, the accumulated dark current value of minor discharge from the vehicle 1 in the parked state can be precisely calculated.

Thus, as compared to the scheme in which the dark current (minor discharge current) in the parked state is not estimated or the scheme in which the accumulated dark current value is calculated by integrating predetermined values, the accumulated dark current value of discharge from the vehicle 1 in the parked state is precisely calculated. Thus, the SOC estimation precision of the vehicle 1 in the parked state improves.

After determining the reference value through the determination process, in the check process, the CPU 33 checks whether or not the measured current value exceeds the reference range. When the count of the measured current value exceeding the reference range exceeds the allowable deviation count, the CPU 33 determines that the dark current value has changed to a current value different from the reference value, and updates the reference value. The CPU 33 integrates the updated reference values.

Upon an increase in the dark current value due to activation of the security system of the vehicle 1 or the like, or upon a reduction in the dark current value due to minor charge with the solar photovoltaic power generation apparatus mounted on the vehicle 1 or the like, the reference value is quickly updated. Hence, when the dark current has changed also, the accumulated dark current value of discharge from the vehicle 1 in the parked state is calculated precisely.

A method for precisely calculating the accumulated dark current value may be, for example, as follows: measuring current for a plurality of times (100 times) every time the CPU activates (every one second) and calculating the reference value every time; and determining the accumulated dark current value by integrating the reference values at those times.

However, in the method in which the reference value is determined every activation of the CPU, current measurement of a plurality of times (100 times) is performed every activation of the CPU. Therefore, while the accumulated dark current value is calculated precisely, the power consumption for calculating the accumulated dark current value becomes great.

On the other hand, according to the present embodiment, after the CPU determines the reference value by performing current measurement for a plurality of times (100 times) through the determination process, in the check process, the CPU just once performs current measurement to check whether or not the measured current value deviates from the reference range. Hence, as compared to the method in which the reference value is calculated every activation of the CPU 33, a reduction in power consumption is achieved.

After determining the reference value through the determination process, the CPU executing the check process that completes faster than the determination process will suffice. Hence, as compared to the method in which the reference value is calculated every activation of the CPU, a reduction in power consumption is achieved.

When the number of times of measuring current in the determination process according to the present embodiment is, for example, 1000 times, and the number of times of measuring current in the method in which the reference value is determined every time is, for example, 100 times, the number of times of measuring current is 1000 times or smaller in the latter method up to 10 activations of the CPU and hence the power consumption is small. However, when the activation of the CPU exceeds 10 times (10 minutes), the number of times of measuring current disadvantageously exceeds 1000 times.

In the case where the number of times of measuring current in the determination process according to the present embodiment is greater than the number of times of measuring current in the method of determining the reference value every time also, the present embodiment can reduce the power consumption as compared to the method of determining the reference value every time because the parking period of the vehicle continues for long hours. Further, since the number of times of measuring current in the determination process according to the present embodiment is greater than the number of times of measuring current in the method in which the reference value is determined every time, the present embodiment can further reduce errors of the reference value relative to the true value of dark current.

Other possible method may include: periodically updating the reference value by periodically executing the determination process or by executing the determination process in accordance with the number of times of activation of the CPU; and calculating the accumulated dark current value using the updated reference values.

However, in the present embodiment, the determination process is executed to determine the reference value at the first activation of the CPU 33 since the beginning of the periodical activation mode, and thereafter the reference value is not updated until the measured current value deviates from the reference range for a plurality of times in the check process.

That is, the determination process is not executed unless the dark current value changes, so that the determination process is not unduly executed. Therefore, as compared to the method in which the determination process is periodically executed or executed in accordance with the number of times of activation of the CPU, the present embodiment can reduce the power consumption.

The energy storage element 21 of the vehicle 1 is often used with the SOC falling within a range of 70% to 90% in consideration of charging by the vehicle power generator 4 or discharging to the vehicle load 3. However, as shown in FIG. 7, since the energy storage element 21 exhibits the flat region where the SOC falls within a range of 30% to 95%, it is difficult to reset the accumulation errors in SOC estimation by the OCV method.

However, since the precision in estimating dark current (minor discharge current) that flows while parking improves through the dark current estimation process, in the case where SOC must be estimated inevitably by the current integration method, the dark current estimation process is extremely effective.

Details of Other Exemplary Embodiments

The technique disclosed in the present specification is not limited to the embodiment shown in the foregoing description and the drawings referred to, and includes various modes such as follows, for example:

(1) In the above-described embodiment, an exemplary electrochemical element is a lithium ion battery employing an iron phosphate-based positive electrode active material. However, the present disclosure is not limited thereto. The electrochemical element may be a secondary battery other than a lithium ion secondary battery, a lithium ion primary battery, a primary battery other than a lithium ion primary battery, or a capacitor such as an electric double-layer capacitor operating with an electrochemical phenomenon.

(2) In the above-described embodiment, the state where a predetermined time has elapsed since the last communication from the vehicle ECU 5 to the CPU 33 is determined as the parked state. However, the present disclosure is not limited thereto. It may be determined that the vehicle has entered the parked state when communication from the vehicle ECU to the CPU has ceased and the discharge current from the assembled battery becomes less than a predetermined value, or when the discharge current from the assembled battery becomes less than a predetermined value.

Figure 13:
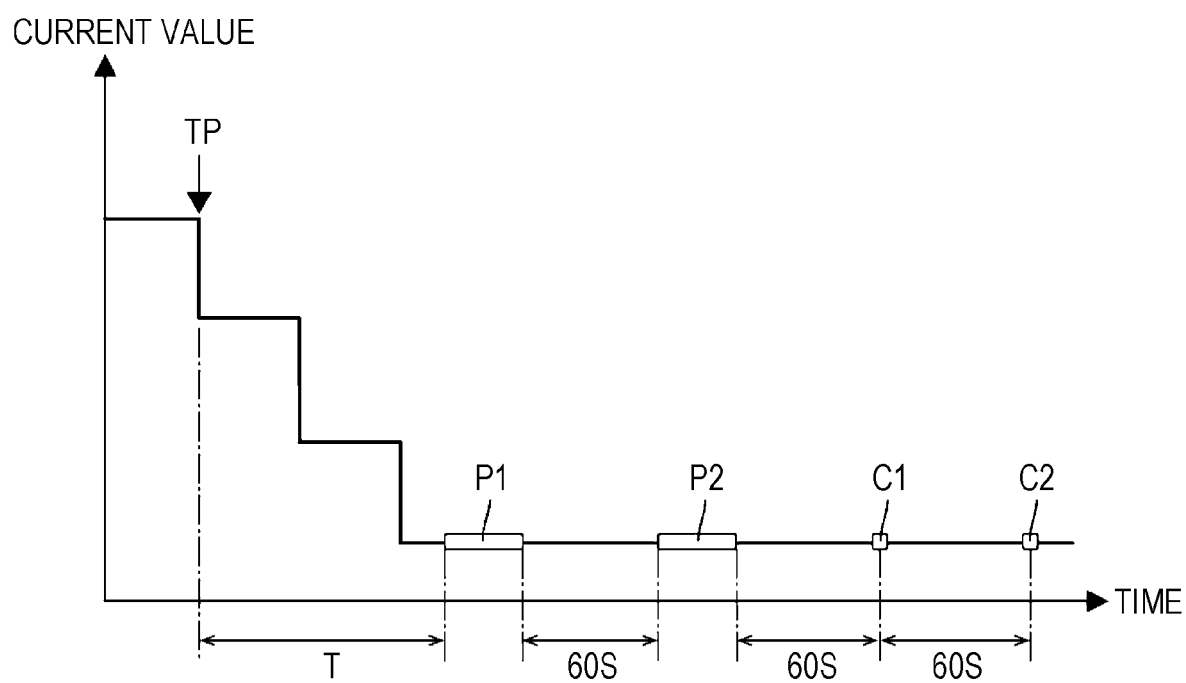
FIG. 13 is a graph showing the timing of the determination process and that of the check process according to another embodiment.

(3) In the above-described embodiment, in the determination process, the reference value is determined based on measured current values measured for a plurality of times at the first activation of the CPU 33. However, the present disclosure is not limited thereto. As shown in FIG. 13 in which X-axis indicates time and Y-axis indicates current values, showing the timing of the determination process and that of the check process, the reference value may be determined in the determination process using the measured current values measured at a plurality of times of activation of the CPU, such as at the first activation P1 and the second activation P2.

(4) In the above-described embodiment, in the check process, a single-time current measurement is performed upon activation of the CPU 33, and whether or not the measured current value deviates from the reference range is checked. However, the present disclosure is not limited thereto. The current measurement may be performed for a plurality of times upon activation of the CPU, and whether or not the average value of the measured current values deviates from the reference range reference range may be checked.

(5) In the above-described embodiment, an automobile has been exemplary shown as the vehicle 1 on which the energy storage apparatus 10 is mounted. However, the present disclosure is not limited thereto. The energy storage apparatus disclosed in the present specification is applicable to a vehicle other than an automobile, such as a train or a motorcycle.

(6) In the above-described embodiment, the assembled battery 20 includes four energy storage elements 21. However, the present disclosure is not limited thereto. The assembled battery may include the energy storage elements being three or less, or five or more in number.

(7) In the above-described embodiment, after the periodical activation mode is entered, the reference value is determined in the determination process upon the first activation of the CPU 33, and the reference value is not changed so long as the measured current value does not deviate from the reference range in the following check process. However, the present disclosure is not limited thereto. The reference value may be updated by periodically executing the determination process, or the reference value may be updated by executing the determination process in accordance with the number of times of activation of the CPU.

The invention claimed is:

1. A managing apparatus for an electrochemical element mounted on a vehicle, the managing apparatus comprising:
    a control unit activating at an interval of a predetermined time in a parked mode of the vehicle; and
    a current measuring unit measuring a current value,
    wherein the control unit is configured, while in the parked mode, to execute:
        a determination process of calculating a reference value from measured current values measured for a plurality of times;
        a check process of checking, at the interval of the predetermined time, whether or not a measured current value measured after the determination process deviates from a reference range that is based on the reference value; and
        an estimation process of estimating current, which has flowed in the parked mode by integrating, while the measured current value measured in the check process does not deviate from the reference range, current based on the reference value.

2. The managing apparatus for an electrochemical element according to claim 1, wherein, in the check process, the reference value is updated through the determination process when the measured current value exceeds the reference range.

3. The managing apparatus for an electrochemical element according to claim 2, wherein, in the check process, the reference value is updated through the determination process when the measured current value exceeds the reference range successively for a predetermined number of times.

4. The managing apparatus for an electrochemical element according to claim 1, wherein the electrochemical element exhibits a flat region where, in a relationship between a state of charge (SOC) and an open circuit voltage (OCV), an OCV variation amount relative to an SOC variation amount is smaller than a predetermined value.

5. The managing apparatus for an electrochemical element according to claim 4, wherein the flat region is a region in which a variation in the OCV falls within a range of 2 mV to 6 mV relative to a variation of 1% of the SOC.

6. The managing apparatus for an electrochemical element according to claim 1, wherein the managing apparatus performs at least one state of charge (SOC) estimation method out of a current integration method and an open circuit voltage (OCV) method.

7. The managing apparatus for an electrochemical element according to claim 1, wherein the electrochemical element is a lithium ion battery employing an iron phosphate-based positive electrode active material.

8. The managing apparatus for an electrochemical element according to claim 1, wherein the control unit updates the reference value by executing the determination process in accordance with a number of times of the activation of the control unit.

9. The managing apparatus for an electrochemical element according to claim 1, wherein, in the check process, the reference value is not updated while the measured current value does not deviate for a plurality of times from the reference range.

10. An energy storage apparatus comprising:
    the managing apparatus according to claim 1; and
    an electrochemical element.

11. A vehicle comprising the energy storage apparatus according to claim 10.

12. The vehicle according to claim 11, wherein the electrochemical element is used with a state of charge (SOC) falling within a range of 70% to 90%.

13. The vehicle according to claim 11, wherein:
    the vehicle further comprising a starting motor for starting up an engine, and
    the energy storage apparatus is connected to the starting motor.

14. The vehicle according to claim 13, wherein the energy storage apparatus discharges a current of 1000 amperes or greater in starting up the engine.

15. The vehicle according to claim 11, wherein, when discharge current from the energy storage apparatus becomes less than a predetermined value, the control unit determines that the vehicle has entered in a parked mode.

16. The vehicle according to claim 11, further comprising a solar photovoltaic power generation apparatus.

17. The vehicle according to claim 11, wherein the discharge current from the energy storage apparatus in the parked mode falls within a range of several milliamperes to several tens of milliamperes.

18. The managing apparatus for an electrochemical element according to claim 1, wherein the reference value is calculated as an average value of the measured current values obtained for the plurality of times.

19. A method of managing an electrochemical element mounted on a vehicle, the method comprising the steps of:
    activating a control unit at an interval of a predetermined time in a parked mode of the vehicle;
    while in the parked mode using the activated control unit for:
        calculating a reference value based on measured current values measured for a plurality of times;
        checking, at the interval of the predetermined time, whether or not a measured current value measured after the determining deviates from a reference range that is based on the reference value; and
        estimating current, which has flowed in the parked mode by integrating, while the measured current value measured in the checking does not deviate from the reference range, current based on the reference value.

20. A memory storing a program executed by a control unit managing an electrochemical element mounted on a vehicle, the program causing the control unit to be executed for:
    activating at an interval of a predetermined time in a parked mode of the vehicle;
    while in the parked mode:
        calculating a reference value based on measured current values measured for a plurality of times;
        measuring current of the electrochemical element;
        checking, at the interval of the predetermined time, whether or not the measured current value after the determining deviates from a reference range that is based on the reference value; and
        estimating current, which has flowed in the parked mode by integrating, while the measured current value measured in the checking does not deviate from the reference range, current based on the reference value.

* * * * *